(12) United States Patent
Murata

(10) Patent No.: US 6,517,259 B1
(45) Date of Patent: Feb. 11, 2003

(54) OPTICAL MODULE AND METHOD OF MANUFACTURING THE SAME, AND OPTICAL TRANSMISSION DEVICE

(75) Inventor: Akihiro Murata, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 85 days.

(21) Appl. No.: 09/593,453

(22) Filed: Jun. 14, 2000

(30) Foreign Application Priority Data

Jun. 16, 1999 (JP) .............................. 11-169661
Apr. 18, 2000 (JP) ........................... 2000-116439

(51) Int. Cl.[7] .............................. G02B 6/36; G02B 6/42
(52) U.S. Cl. .............................. 385/92; 385/49; 385/91
(58) Field of Search .............................. 385/90, 91, 92, 385/49, 94

(56) References Cited

U.S. PATENT DOCUMENTS

| 4,186,996 A | * | 2/1980 | Bowen et al. ............. 350/96.2 |
| 4,779,947 A | * | 10/1988 | Ito ............................. 350/96.2 |
| 4,824,202 A | * | 4/1989 | Auras ...................... 350/96.18 |
| 5,631,987 A | | 5/1997 | Lasky et al. .................. 385/88 |
| 5,774,614 A | | 6/1998 | Gilliland et al. ............... 385/88 |
| 5,815,616 A | | 9/1998 | Bishop et al. ................. 385/52 |
| 5,818,990 A | | 10/1998 | Steijer et al. ................. 385/49 |
| 6,019,523 A | * | 2/2000 | Honmou ...................... 385/94 |
| 6,164,837 A | * | 12/2000 | Haake et al. ................. 385/90 |
| 6,170,996 B1 | * | 1/2001 | Miura et al. .................. 385/94 |

FOREIGN PATENT DOCUMENTS

| EP | 0726477 A2 | | 1/1996 |
| JP | 54-35750 | | 3/1979 |
| JP | 1-229208 A | * | 9/1989 |
| JP | 10-339824 | | 12/1998 |

* cited by examiner

Primary Examiner—John D. Lee
Assistant Examiner—Jennifer Doan
(74) Attorney, Agent, or Firm—Oliff & Berridge, PLC

(57) ABSTRACT

An optical module comprises a platform, an optical element having an optical section and mounted on the platform, an optical fiber attached and positioned with respect to the optical section, and dummy bumps holding an end surface of the optical fiber in a state of non-contact with the optical section.

19 Claims, 8 Drawing Sheets

OPTICAL MODULE AND METHOD OF MANUFACTURING THE SAME, AND OPTICAL TRANSMISSION DEVICE

BACKGROUND OF THE INVENTION

1. Field of the Invention

The present invention relates to an optical module and method of manufacturing the same, and to an optical transmission device.

2. Description of the Related Art

In recent years, there has been a trend toward increased speeds and volumes in data communications, and developments in optical communications continue. Generally, in optical communications, an electrical signal is converted to an optical signal, and the optical signal is transmitted through an optical fiber, then the received optical signal is converted to an electrical signal. The conversion between electrical signals and optical signals is done by optical elements.

For example, Japanese Patent Application Laid-Open No. 10-339824 discloses an optical fiber positioned and fixed on a platform in which a V-groove is formed, to constitute an optical module.

However, even when the optical fiber is positioned using the V-groove, there remains the problem that it is not possible to carry out positioning in the axial direction of the optical fiber. As a result, there is a possibility to damage the optical element by the contact with the end surface of the optical fiber.

SUMMARY OF THE INVENTION

The present invention solves this problem, and has as it object the provision of an optical module allowing damage to an optical element to be prevented, a method of manufacturing the same, and an optical transmission device.

(1) An optical module of one aspect of the present invention comprises:
  an optical element having an optical section;
  a platform on which the optical element and an optical waveguide are mounted; and
  a stop for disposing one end surface of the optical waveguide in a state of non-contact with the optical section.

Since the optical element is mounted on the platform, the positioning of the optical waveguide and the optical section of the optical element can be carried out by positioning the optical waveguide with respect to the platform. Since the end surface of the optical waveguide is held in a state of non-contact with the optical section by the stop, damage to the optical section is prevented.

(2) In this optical module,
  a conductive layer may be formed on the platform, and
  the optical element may have at least one bump on a surface on which the optical section is formed.

(3) In this optical module,
  a through hole may be formed in the platform, and
  the optical section may be mounted on the optical element in a manner to oppose one opening of the through hole.

(4) In this optical module,
  the optical waveguide may be inserted in the through hole,
  the optical element may have at least one non-electrical-connection bump on the surface on which the optical section is provided, and
  the non-electrical-connection bump may contact the one end surface of the optical waveguide, and may have a function to maintain a non-contact disposition of the optical waveguide with the optical section.

(5) In this optical module,
  the optical waveguide may be inserted in the through hole, and
  a first part of the bump may be formed in a position to be bonded to the conductive layer, and a second part of the bump may be formed in a position to contact the one end surface of the optical waveguide.

(6) In this optical module,
  a projection may be formed in the through hole to reduce the diameter of the through hole,
  the optical waveguide may be inserted in the through hole and
  the projection may function as the stop that contacts the one end surface of the optical waveguide.

(7) In this optical module,
  the through hole may have a recess accommodating the optical element at a first opening thereof opposite to a second opening thereof at which the optical waveguide is inserted.

(8) In this optical module,
  a substrate may be mounted on the platform, the substrate having a through hole of which diameter is larger than the diameter of the through hole formed in the platform,
  the through holes formed in the platform and the substrate may be connected,
  the optical waveguide may be inserted in the through hole formed in the substrate, and
  a part of one surface of the platform may function as a stop that contacts the one end surface of the optical waveguide.

(9) In this optical module,
  the stop may contact the end surface of a cladding, avoiding a core of the optical waveguide.

(10) In this optical module,
  the stop may be formed by an optically transmitting member, and
  the stop may be formed at the one opening of the through hole so as to contact the one end surface of the optical waveguide.

(11) This optical module may further comprise a sealing portion for sealing at least an electrical connection portion of the optical element.

(12) In this optical module,
  the sealing portion may comprise a first resin portion for sealing the electrical connection portion of the optical element, and a second resin portion for sealing the first resin portion.

(13) In this optical module,
  the first resin portion may be softer than the second resin portion.

By this means, no large stress is applied to the electrical connection portion of the optical element, and therefore the connection is protected.

(14) An optical transmission device of another aspect of the present invention comprises:
  a plurality of platforms;
  a light-emitting element having a light-emitting section, and mounted on a first platform of the plurality of platforms;
  a light-receiving element having a light-receiving section, and mounted on a second platform of the plurality of platforms, the second platform being different from the first platform;

an optical waveguide of which end portions being inserted into the first and the second platforms; and a stop for disposing end surfaces of the optical waveguide in a state of non-contact with the light-emitting section and light-receiving section.

Since the light-emitting element and light-receiving element are mounted on respective platforms, the positioning of the optical waveguide and the light-emitting section or light-receiving section can be carried out by positioning the optical waveguide with respect to each platform. Since the end surface of the optical waveguide is held in a state of non-contact with the light-emitting section and light-receiving section by the stop, damage thereto can be prevented.

(15) This optical transmission device may further comprise:

a plug connected to the light-emitting element; and another plug connected to the light-receiving element.

By this means, a plurality of electronic instruments can be connected by connecting the plugs to electronic instruments.

(16) A method of manufacturing an optical module as further aspect of the present invention comprises:

a step of mounting an optical element having an optical section on a platform; and a step of positioning and attaching an optical waveguide with respect to the optical section, and in the step of attaching the optical waveguide, an end surface of the optical waveguide may be held in a state of non-contact with the optical section by means of a stop.

Since the optical element is mounted on the platform, the positioning of the optical waveguide and the optical section of the optical element can be carried out by positioning the optical waveguide with respect to the platform. Since the end surface of the optical waveguide is held in a state of non-contact with the optical section by the stop, damage to the optical section is prevented.

(17) The method of manufacturing an optical module in this aspect may further comprise:

a step of forming a first resin portion by sealing the electrical connection portion of the optical element by means of a first resin; and a step of forming a second resin portion by sealing the first resin portion by means of a second resin after the step of forming the first resin portion.

(18) In this method of manufacturing an optical module, the first resin portion may be softer than the second resin portion.

Since no large stress is applied to the electrical connection portion of the optical element, the connection portion is protected.

DETAILED DESCRIPTION OF THE PREFERRED EMBODIMENTS

The present invention is now described in terms of a number of preferred embodiments, with reference to the drawings.

First Embodiment

Figure 1A:
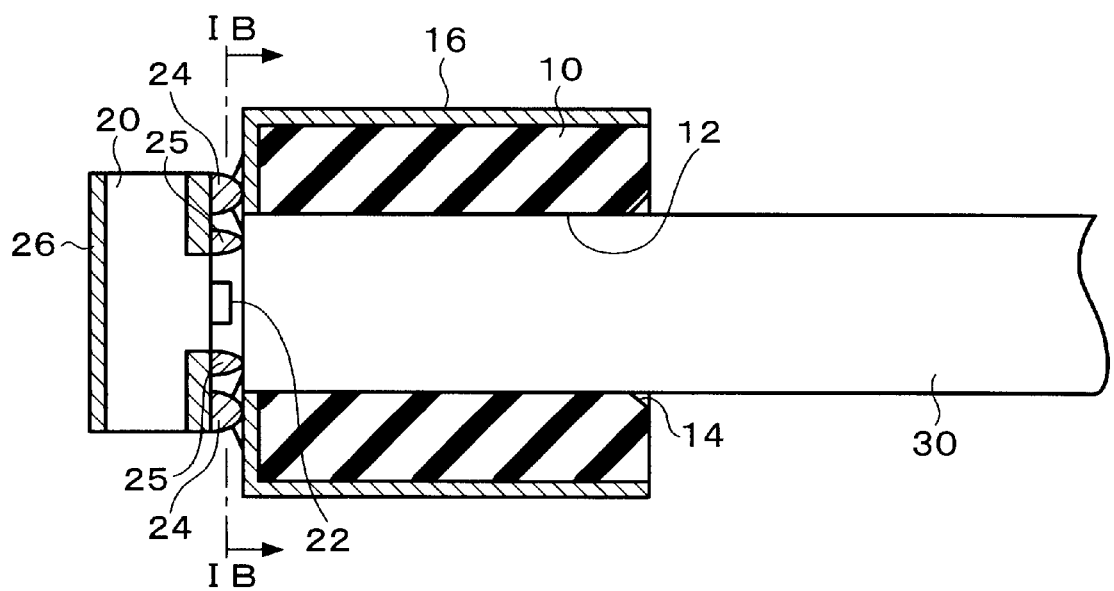
FIGS. 1A and 1B show an optical module of a first embodiment to which the present invention is applied.

FIG. 1A shows a first embodiment of an optical module to which the present invention is applied. This optical module comprises a platform 10, an optical element 20, and an optical fiber 30. The optical fiber 30 is one example of an optical waveguide.

There is no particular restriction on the overall form of the platform 10, but it may be for example a rectangular parallelepiped, a cube, or a sheet form. Generally, one surface of the platform 10 is connected with a corner to another surface or a side surface. There is no particular restriction on the material constituting the platform 10, and it may be an insulator, a conductor, or a semiconductor, and may for example be any of silicon, ceramic, a metal such as iron or copper, or a resin.

On one surface of the platform 10 is mounted the optical element 20. When the platform 10 is a rectangular parallelepiped or sheet form, the optical element 20 is mounted on the largest surface. In the platform 10, a through hole 12 may be formed. The opening at one end of the through hole 12 is formed in the surface on which the optical element 20 is mounted, and the other opening is formed in a surface other than that on which the optical element 20 is mounted. The through hole 12 receives the inserted optical fiber 30, and provides positioning in the direction orthogonal to its axis. The through hole 12 may be a circular hole or a rectangular hole, and the inner surface of the through hole 12 preferably contacts the optical fiber 30 to a degree allowing positioning of the optical fiber 30.

At the end of the opening, which is opposite to one opening of the through hole 12 formed in the surface on which the optical element 20 is mounted, a taper 14 may be formed. The taper 14 is formed to widen toward the outside, and therefore the diameter of the taper 14 is larger than the diameter of the through hole 12. By means of this, the optical fiber 30 can be more easily inserted in the through hole 12. The opening formed by the taper 14 may be circular or a rectangle or other polygon as seen in plan view.

On the platform 10, a conductive layer 16 may be formed. The conductive layer 16 is formed on the surface of the platform 10 on which the optical element 20 is mounted. In this surface the opening of the through hole 12 is formed, and the conductive layer 16 is formed avoiding the opening of the through hole 12. When the platform 10 is formed of a conductive material, the conductive layer 16 is preferably formed with an insulating film interposed. For example, when the platform 10 is formed of silicon, a silicon oxide film may be formed on the surface, and the conductive layer 16 formed thereupon.

The conductive layer 16 is electrically connected to the optical element 20, and therefore as required may also form an interconnecting pattern. The conductive layer 16 may be formed to extend as far as a surface that is different from the surface of the platform 10 on which the optical element 20 is mounted. For example, the conductive layer 16 may be formed to extend to a side surface that is connected with the surface on which the optical element 20 is mounted by an intervening corner.

The optical element 20 may be a light-emitting element, or a light-receiving element. As an example of a light-emitting element maybe used a surface emitting element, and particularly a surface emitting laser. A surface emitting element such as a surface emitting laser emits light in a direction perpendicular to the substrate. The optical element 20 includes an optical section 22. When the optical element 20 is a light-emitting element, the optical section 22 is a light-emitting section, and when the optical element 20 is a light-receiving element, the optical section 22 is a light-receiving section. When the optical section 22 is a light-emitting section, the size of the light-emitting section and the diameter of the through hole 12 are preferably determined so that all of the light emitted by the light-emitting section passes into the through hole 12. For example, the diameter of the through hole 12 may be larger than the diameter of the light-emitting section.

To enable external electrical connection, the optical element 20 may have at least one bump 24. For example, on the surface on which the optical section 22 is formed, bumps 24 may be provided to allow external electrical connection to the optical element 20. The bumps 24 are provided in positions such as to allow electrical connection to other elements. For example, the bumps 24 are provided in positions to avoid the through hole 12 in the platform 10. The bumps 24 preferably project further than the optical section 22.

The optical element 20 is mounted on the platform 10. In more detail, the optical element 20 is mounted with the optical section 22 oriented in the direction of the through hole 12 in the platform 10. The optical element 20 is electrically connected to the conductive layer 16 formed on the platform 10. The bumps 24 of the optical element 20 may also be bonded to the conductive layer 16. For example, using metal bonding with solder or the like or conductive adhesive, the bumps 24 and conductive layer 16 may be bonded.

In this embodiment, dummy bumps 25 are provided as stops to hold the end surface of the optical fiber 30 in a position not in contact with the optical section 22 of the optical element 20. The dummy bumps 25 may be provided on the surface on which the bumps 24 are formed. The dummy bumps 25 may be formed of the same material as the bumps 24, and may be electrically connected inside the optical element 20, but they are not externally electrically connected.

Since the dummy bumps 25 are stops, they are provided in a position such as to be contacted by the end surface of the optical fiber 30. For example, the dummy bumps 25 are formed in the area within the through hole 12 of the platform 10. Since the dummy bumps 25 are provided to hold the end surface of the optical fiber in a position not in contact with the optical section 22 of the optical element 20, they are provided projecting beyond the optical section 22. By means of the dummy bumps 25, the end surface of the optical fiber 30 is prevented from contacting the optical section 22, and damage to the optical section 22 can be prevented.

On a surface other than that on which the bumps 24 are provided, an electrode 26 may be provided. When the optical element 20 is a surface emitting laser or other semiconductor laser, the electrode 26 may be provided on the surface opposite to that on which the bumps 24 are provided.

Figure 1B:
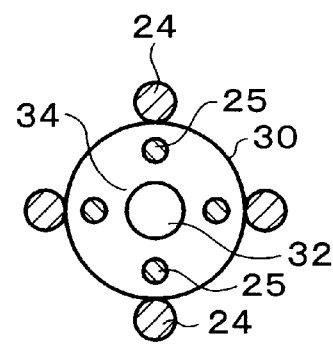

FIG. 1B is an abbreviated diagram of a part of the cross-section along the line IB—IB in FIG. 1A. In more detail, the optical fiber 30, the bumps 24, and the dummy bumps 25 acting as stops are shown in FIG. 1B.

The optical fiber 30 includes a core 32 and a concentric circular surrounding cladding 34, so that light is reflected by the boundary between the core 32 and the cladding 34, trapped within the core 32, and thus transmitted. The periphery of the cladding 34 is commonly protected by a jacket not shown in the drawings.

The optical fiber 30 is inserted in the through hole 12 in the platform 10. The optical section 22 of the optical element 20 mounted on the platform 10 is oriented in the direction of the through hole 12 in the platform 10. Therefore, the optical fiber 30 inserted in the through hole 12 is positioned with respect to the optical section 22 in the directions orthogonal to the axis of the optical fiber 30. By means of the dummy bumps 25 acting as stops, the optical fiber 30 is positioned in the axial direction with respect to the optical section 22.

As shown in FIG. 1B, the dummy bumps 25 acting as stops are preferably provided in positions to avoid the core 32 of the optical fiber 30. More specifically, the dummy bumps 25 are preferably positioned over the cladding 34. Alternatively, the dummy bumps 25 may be provided over a part of the core 32 (for example, the extremity) if the transmission or reception of light is not impaired.

According to this embodiment, by providing the dummy bumps 25 as stops, the end surface of the optical fiber 30 does not contact the optical section 22 of the optical element 20, and there is no damage thereto. By means of the dummy bumps 25 acting as stops, the positioning of the end surface of the optical fiber 30 with respect to the optical section 22 is achieved. That is to say, by means of the dummy bumps 25, the positioning of the optical fiber 30 in the axial direction can be achieved simply.

This embodiment is constructed as described above, and the method of manufacture thereof is now described.

In the method of manufacturing the optical module, the platform 10 and optical element 20 are prepared. Then the optical element 20 is mounted on the platform 10. The optical element 20 may be mounted on the platform 10 and electrically connected to the conductive layer 16. The optical section 22 of the optical element 20 is oriented into the through hole 12. The optical element 20 and the conductive layer 16 of the platform 10 may be connected by the bumps 24. For example, by bonding of the conductive layer 16 and bumps 24, the optical element 20 and platform 10 may be fixed.

The optical fiber 30 is positioned with respect to the optical section 22, and attached. For example, the optical fiber 30 is inserted into the through hole 12 in the platform 10. By this means, the optical fiber 30 is positioned in the directions orthogonal to the axis. In this embodiment, the end surface of the optical fiber 30 contacts the dummy bumps 25 acting as stops. For example, the dummy bumps 25 are positioned on the inside of the through hole 12. Therefore, by contacting the dummy bumps 25, the positioning in the axial direction of the optical fiber 30 can be achieved. Here the dummy bumps 25 are provided to project beyond the optical section 22, and therefore the end surface of the optical fiber 30 does not contact the optical section 22. In this way, damage to the optical section 22 can be eliminated.

When the platform 10 is formed of a semiconductor such as silicon or the like, the through hole 12 may be formed using a laser. Before forming the through hole 12, an isotropic etching may be applied to form a recess in the position where the through hole 12 will be formed in the platform 10. It should be noted that the recess may have a precise triangular cross-section along the crystal planes, or may have a quadrilateral cross-section. The plane form of the opening of the recess is not particularly restricted, but may be oblong. When the opening of the recess is oblong, one side is preferably longer than the diameter of the optical fiber 30. In this way, at least a part of the recess can form the taper 14. Then a laser beam can be directed into the recess, to form the through hole 12. It should be noted that a recess may be formed in each of the positions where both openings of the through hole 12 will be formed, and the platform 10 penetrated between the pair of recesses disposed on mutually opposing sides. Furthermore, the hole, which has been formed with a laser, may be subjected to etching in order to increase the diameter. Alternatively, through hole 12 the optical excitation electropolishing method may be applied to the formation of the hole.

The present invention is not restricted to the above-described embodiment, and the following variations maybe made.

Second Embodiment

Figure 2A:
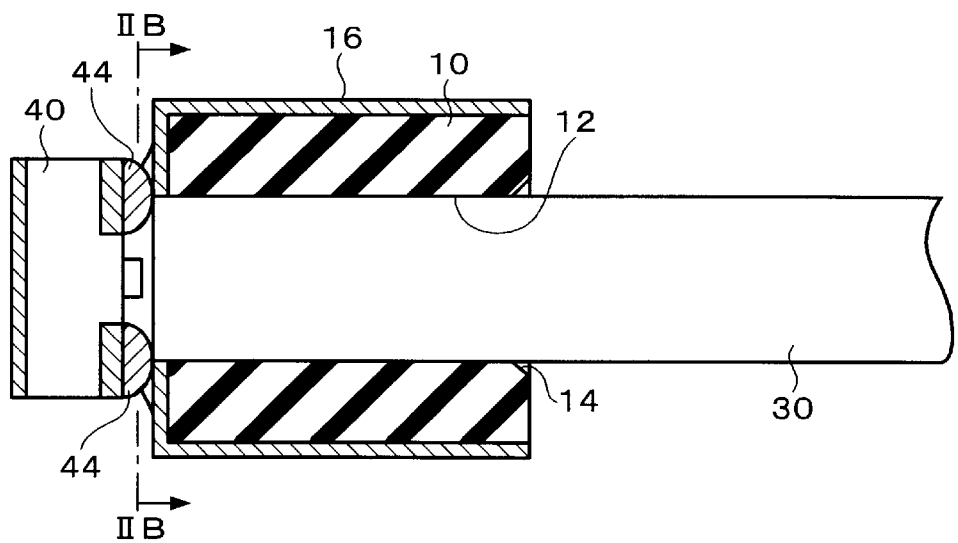
FIGS. 2A and 2B show an optical module of a second embodiment to which the present invention is applied.
Figure 2B:
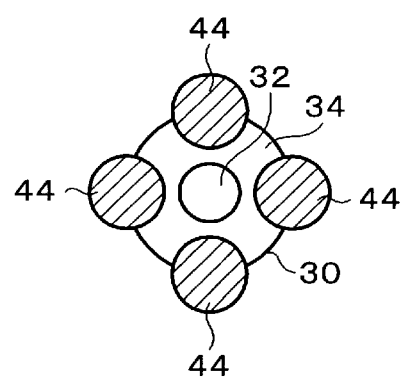

FIG. 2A shows a second embodiment of an optical module to which the present invention is applied. FIG. 2B shows a partially abbreviated cross-section along the line IIB—IIB shown in FIG. 2A. In this embodiment, bumps 44 provided on an optical element 40 differ from the bumps 24 of the first embodiment shown in FIG. 1A. The platform 10 and optical fiber 30 are the same as in the first embodiment and therefore description is omitted here.

The bumps 44 serve for external electrical connection of the optical element 40, and also for positioning of the optical fiber 30 in the axial direction. For example, a part of the bumps 44 (a first part) is positioned outside the through hole 12 in the platform 10, while another part of the bumps 44 (a second part) is positioned within the through hole 12. A part of the bumps 44 is bonded to the conductive layer 16 on the outside of the through hole 12 to provide an electrical connection. For the means of bonding the bumps 44 and the conductive layer 16, the method described in the first embodiment can be applied. The other part of the bumps 44 contacts the end surface of the optical fiber 30 within the through hole 12, and achieves positioning in the axial direction of the optical fiber 30. In more detail, the part of the bumps 44 that contacts the end surface of the optical fiber 30 preferably contacts a part avoiding the core 32 of the optical fiber 30. In more concrete terms, the bumps 44 are preferably positioned on the cladding 34. Alternatively, if the reception or transmission of optical signals is not impeded, bumps 44 may be provided on a part of the core 32 (for example on the extremities).

For the remainder of the construction the description in the first embodiment can be applied, and in this embodiment also, the same benefit as in the first embodiment can be achieved. Moreover, in this embodiment, compared with the first embodiment the dummy bumps 25 can be omitted. The optical module of this embodiment can be manufactured using the method of manufacturing the optical module of the first embodiment.

Third Embodiment

Figure 3:
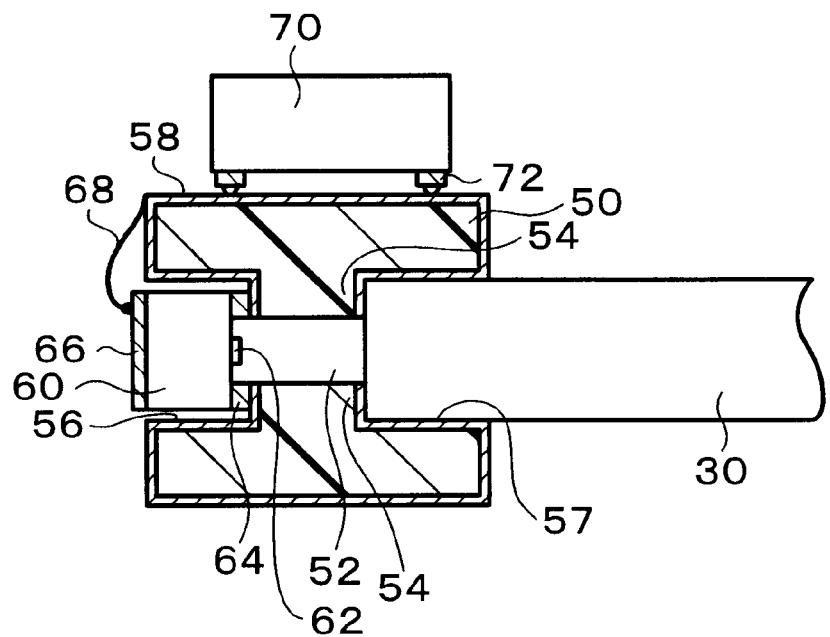
FIG. 3 shows an optical module of a third embodiment to which the present invention is applied.

FIG. 3 shows a third embodiment of an optical module to which the present invention is applied. This optical module includes a platform 50, an optical element 60, and an optical fiber 30. The optical fiber 30 is that described in the first embodiment.

In the platform 50, a through hole 52 is formed. Within the through hole 52 projection 54 reducing the diameter is formed. The projection 54 may be formed as a projecting ring from the inner surface of the through hole 52, or may be formed as a partial projection from the wall not forming a ring. The projection 54 may be provided at an intermediate portion of the through hole 52 (apart other than an opening), or maybe provided at either opening of the through hole 52.

In this embodiment, the optical fiber 30 is inserted in the through hole 52, and the projection 54 contacts the end surface of the optical fiber 30. In this way, the positioning in the axial direction of the optical fiber 30 can be achieved.

The projection 54 is preferably provided so as to avoid the core 32 of the optical fiber 30 (see FIG. 1B). In more concrete terms, the projection 54 is preferably positioned on the cladding 34 or on a jacket not shown in the drawings. In other words, even when the projection 54 is provided, it is preferable that the through hole 52 opens over the core 32. Alternatively, if the reception or transmission of optical signals is not impeded, the projection 54 may be provided so as to contact a part of the core 32 (for example the extremity).

In the platform 50, in the opening on the opposite side to the opening into which the optical fiber 30 is inserted into the through hole 52, a recess 56 may be formed. The recess 56 may be of such a size as to accommodate the optical element 60. In this case also, the optical element 60 is mounted with an optical section 62 facing in the direction of the through hole 52.

It should be noted that the opening of the through hole 52 into which the optical fiber 30 is inserted can also be defined as a recess 57. In this case, the recess 56 can be formed in one opening of the through hole 52, and the recess 57 can be formed in the other opening.

On the platform 50, a conductive layer 58 may be formed. The conductive layer 58 is electrically connected to the optical element 60. For the construction of this connection, the first embodiment can be applied. For example, in the optical element 60, electrodes (or bumps) 64 provided on the surface on which the optical section 62 is formed maybe bonded to the conductive layer 58. In the optical element 60, electrodes 66 provided on the surface opposite to the optical section 62 and the conductive layer 58 may be electrically connected by wires 68.

The conductive layer 58 may be formed on any surface of the platform 50 as long as there is no problem in respect of electrical conductivity. For example, the conductive layer 58 may be formed on the inner surface of the recess 56 accommodating the optical element 60, and on the inner surface of the recess 57 in which the optical fiber 30 is inserted. If the optical element 60 is accommodated in the recess 56, and within the recess 56 the optical element 60 and the conductive layer 58 are electrically connected, then the electrical connection portion is protected from the exterior.

In this embodiment, the conductive layer 58 is formed on the outside surface of the platform 50. On the outside surface of the platform 50, a semiconductor chip 70 is mounted, and electrodes 72 of the semiconductor chip 70 are electrically connected to the conductive layer 58. For the construction of this connection also, the connection construction of the optical element 20 and the conductive layer 16 described in the first embodiment can be applied.

For the remainder of the construction the description in the first embodiment can be applied, and in this embodiment also, the same benefit as in the first embodiment can be achieved.

The optical module of this embodiment can be manufactured using the method of manufacturing the optical module of the first embodiment. For the material of the platform 50 of this embodiment, the description of the first embodiment can be used, but the platform 50 of this embodiment has a more complicated shape than the platform 10 of the first embodiment, and therefore is preferably formed of resin. In the process of manufacturing the platform 50, the recesses 56 and 57 can be formed, then the conductive layer 58 formed, and thereafter the recesses 56 and 57 penetrated to form the through hole 52.

Fourth Embodiment

Figure 4:
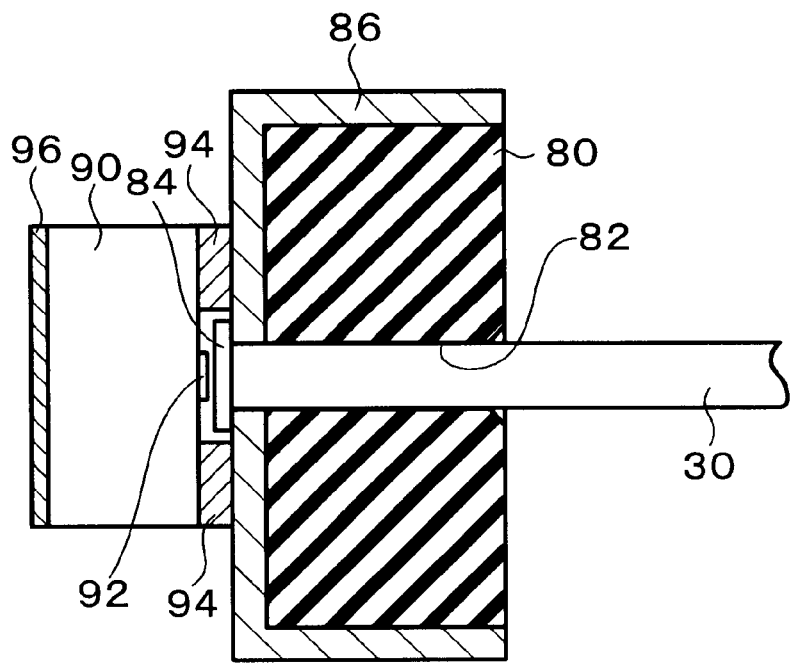
FIG. 4 shows an optical module of a fourth embodiment to which the present invention is applied.

FIG. 4 shows a fourth embodiment of an optical module to which the present invention is applied. This optical module includes a platform 80, and optical element 90, and an optical fiber 30. The optical fiber 30 is that described in the first embodiment.

In the platform 80, a through hole 82 is formed. In one opening of the through hole 82, an optically transmitting member 84 forming a stop is provided. That is to say, by means of the optically transmitting member 84, at least a part of one opening of the through hole 82 (preferably the entirety) is filled. As the optically transmitting member 84 a substrate or tape of a glass or resin or similar material can be used, as long as it transmits light to a degree to permit transmission and reception of optical signals.

On the platform 80 the optical element 90 is mounted, facing an optical section 92 with the optically transmitting member 84 interposed in the direction of the through hole 82. A conductive layer 86 may be formed on the platform 80, and the optical element 90 and the conductive layer 86 may be electrically connected. For example, electrodes 94 provided on the surface on which the optical section 92 of the optical element 90 is formed, and the conductive layer 86 may be bonded and the electrical connection of both achieved. It should be noted that the optical element 90 of this embodiment has the same structure as the optical element 20 described in the first embodiment, in so far as electrodes 96 are provided on the opposite surface to the electrodes 94.

It is preferable for the optical section 92 of the optical element 90 and the optically transmitting member 84 not to contact. For this purpose, if necessary, the electrodes 94 formed on the surface on which the optical section 92 of the optical element 90 is formed, may be formed as bumps.

The optical fiber 30 is inserted into the through hole 82 of the platform 80 from the opening opposite to the opening to which the optically transmitting member 84 is attached. The end surface of the optical fiber 30 contacts the optically transmitting member 84. Therefore, the end surface of the optical fiber 30 is arranged not to contact the optical section 92 of the optical element 90.

For the remainder of the construction the description in the first embodiment can be applied, and in this embodiment also, the same benefit as in the first embodiment can be achieved. The optical module of this embodiment can be manufactured using the method of manufacturing the optical module of the first embodiment.

Fifth Embodiment

Figure 5:
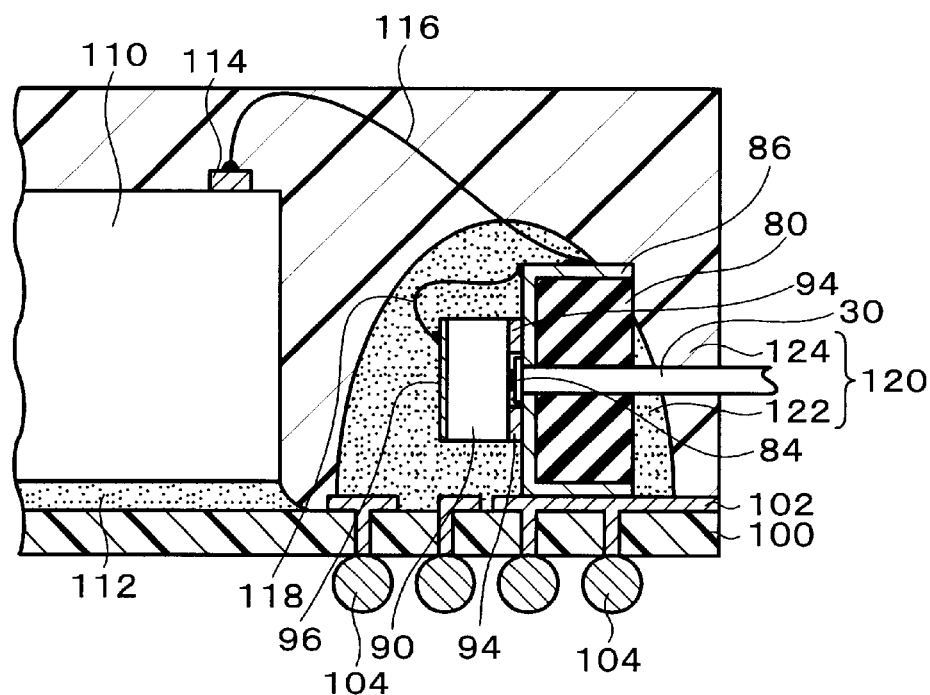
FIG. 5 shows an optical module of a fifth embodiment to which the present invention is applied.

FIG. 5 shows a fifth embodiment of an optical module to which the present invention is applied. This optical module is the optical module shown in FIG. 4 sealed with resin. In FIG. 5, the platform 80 is mounted on a substrate 100.

The substrate 100 may be formed of an organic or inorganic material, and a composite construction thereof is also possible. On the substrate 100, an interconnecting pattern 102 is formed. On the substrate 100, a plurality of external terminals 104 are provided. The external terminals 104 are electrically connected to the interconnecting pattern 102. For example, the interconnecting pattern 102 may be formed on one surface of the substrate 100, the external terminals 104 provided on the other surface, and with through holes formed in the substrate 100 interposed, the external terminals 104 may be electrically connected to the interconnecting pattern 102. As the external terminals 104, solder balls may be used.

On the substrate 100 a semiconductor chip 110 is mounted. The semiconductor chip 110 includes a circuit for driving the optical element 90. In FIG. 5, the semiconductor chip 110 shows an example of face-down bonding. In this case, for example, on the substrate 100 the semiconductor chip 110 maybe adhered with an adhesive 112 avoiding the interconnecting pattern 102. Alternatively, on the interconnecting pattern 102, the semiconductor chip 110 may be adhered with an insulating adhesive. When the semiconductor chip 110 is subjected to face-down bonding, on the interconnecting pattern 102 an an isotropic conductive material such as an an isotropic conductive film or the like may be used, or by metal bonding by solder or the like the semiconductor chip 110 fixed to the substrate 100.

The semiconductor chip 110 and optical element 90 are electrically connected. For example, electrodes 114 of the semiconductor chip 110 and the conductive layer 86 of the platform 80 may be connected by wires 116. In this case, if either of the electrodes 94 and 96 of the optical element 90 are electrically connected to the conductive layer 86, then with the conductive layer 86 interposed, the semiconductor chip 110 is electrically connected to the optical element 90. It should be noted that when the conductive layer 86 is formed continuously on the surface of the platform 80 on which the optical element 90 is mounted, and the other surfaces (for example side surfaces), the conductive layer 86 and semiconductor chip 110 are preferably electrically connected on a surface other than the surface on which the optical element 90 is mounted. By means of this, since the optical element 90 is avoided, the means of electrical connection of the conductive layer 86 and semiconductor chip 110 (for example the wires 116) can be prevented from contacting the optical element 90. Since the region of mounting of the optical element 90 is avoided, a large area of the conductive layer 86 can beused for electrical connection to the semiconductor chip 110.

The semiconductor chip 110 may be electrically connected to the interconnecting pattern 102. For example, electrodes not shown in the drawings of the semiconductor chip 110 and the interconnecting pattern 102 may be connected by wires not shown in the drawings.

The optical element 90 also may be electrically connected to the interconnecting pattern 102. For example, the conductive layer 86 formed on the platform 80 and the interconnecting pattern 102 may be bonded. In more concrete terms, using a conductive adhesive, or by means of metal bonding, the conductive layer 86 and interconnecting pattern 102 can be bonded. In more detail, the electrodes 94 of the optical element 90 and the conductive layer 86 are bonded. On the platform 80, the conductive layer 86 is formed extending continuously on the surface on which the optical element 90 is mounted and another surface (for example a side surface). Of the conductive layer 86, the portion other than the surface on which the optical element 90 is mounted can be bonded to the interconnecting pattern 102.

By means of the above construction, the optical element 90, the interconnecting pattern 102, and the semiconductor chip 110 are electrically connected. Since the external terminals 104 are electrically connected to the interconnecting pattern 102, the external terminals 104, the optical element 20, and the semiconductor chip 110 are electrically connected.

The optical module of this embodiment has a sealing portion 120. The sealing portion 120 seals at least the electrical connection portions of the optical element 90. The sealing portion 120 comprises a first resin portion 122 and a second resin portion 124.

The first resin portion 122 seals the electrical connection portions of the optical element 90. For example, the electrical connection portion of the electrodes 96 of the optical element 90 and wires 118, the electrical connection portion of the wires 118 and the conductive layer 86 formed on the platform 80, and the electrical connection portion of the electrodes 94 of the optical element 90 and the conductive layer 86 formed on the platform 80 are sealed by the first resin portion 122. The first resin portion 122 may seal the electrical connection portion between the platform 80 and other components, or the electrical connection portion between the optical element 90 and other components. For example, the first resin portion 122 may seal the electrical connection portion between the interconnecting pattern 102 formed on the substrate 100 and the conductive layer 86 formed on the platform 80. The first resin portion 122 may seal the electrical connection portion between the wires 116 connected to the semiconductor chip 110 and the conductive layer 86 formed on the platform 80. Furthermore, the first resin portion 122 may seal at least either of, and preferably both of, the platform 80 and optical element 90.

The second resin portion 124 seals the first resin portion 122. The second resin portion 124 may seal the electrical connection portion between the semiconductor chip 110 and other components. For example, the second resin portion 124 seals the electrical connection portion between the electrodes 114 of the semiconductor chip 110 and the wires 116. Furthermore, the second resin portion 124 preferably seals a part of the optical fiber 30, and acts as a retainer to prevent detachment from the platform 80.

The first resin portion 122 is preferably softer than the second resin portion 124. For example, it is preferable that the stress occurring as a result of shrinkage or expansion of the first resin portion 122 is lower than of the second resin portion 124. Alternatively, it is preferable that the first resin portion 122 is better than the second resin portion 124 at absorbing externally applied stress. By means of a softer first resin portion 122, the electrical connection portion between the platform 80 and the optical element 90 can be protected. On the other hand, since the second resin portion 124 is not required to be as soft as the first resin portion 122, a wider choice of materials is available.

In the method of manufacturing the optical module of this embodiment, a platform 80 with the optical element 90 already mounted may be mounted on the substrate 100. The step of inserting the optical fiber 30 in the through hole 82 of the platform 80 may be carried out before the mounting of the platform 80 on the substrate 100, or it may be carried out thereafter. The semiconductor chip 110 driving the optical element 90 may be previously mounted on the substrate 100. Alternatively, the platform 80 may be mounted on the substrate 100, and then the semiconductor chip 110 mounted on the substrate 100.

When the platform 80 is mounted on the substrate 100, the sealing portion 120 maybe provided. For example, first by means of a first resin the electrical connection portions of the optical element 90 are sealed forming the first resin portion 122. Thereafter, by means of a second resin, the first resin portion 122 is sealed forming the second resin portion 124. Here the first and second resins are selected in such a way that the first resin portion 122 is softer than the second resin portion 124.

In this way, for example, the first resin portion 122 incurs less stress generated when shrinkage or expansion occurs than the second resin portion 124. Alternatively, the first resin portion 122 is better than the second resin portion 124 at absorbing externally applied stress. By means of a softer first resin portion 122, the electrical connection portions of the optical element 90 can be protected. On the other hand, since the second resin portion 124 is not required to be as soft as the first resin portion 122, a wider choice of materials is available for the second resin.

It should be noted that the construction in which by means of the sealing portion 120 shown in FIG. 5 (at least either of the first resin portion 122 and second resin portion 124), at least one of the optical element 90, the platform 80 and the semiconductor chip 110 is sealed, can be applied also to the first to fourth embodiments described above.

Sixth Embodiment

Figure 6:
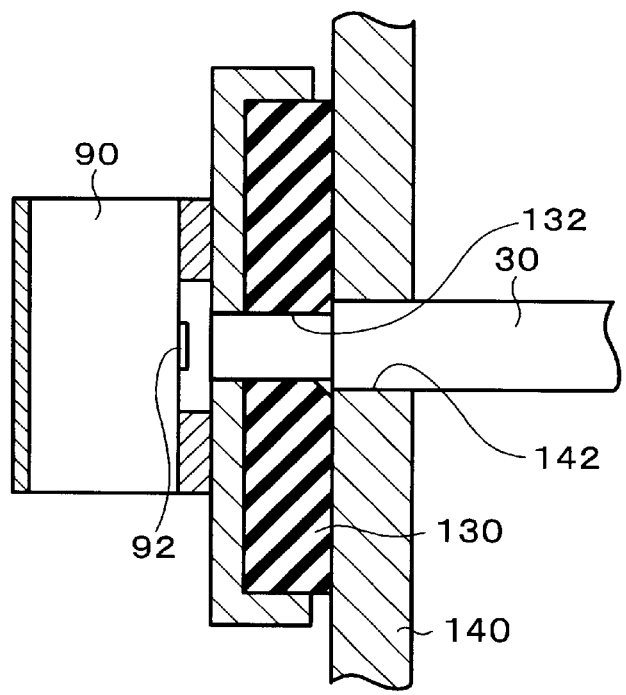
FIG. 6 shows an optical module of a sixth embodiment to which the present invention is applied.

FIG. 6 shows a sixth embodiment of an optical module to which the present invention is applied. This optical module includes an optical element 90, a platform 130, an optical fiber 30, and a substrate 140. The optical element 90 is that described in the fifth embodiment, and the optical fiber 30 is that described in the first embodiment.

In the platform 130, a through hole 132 is formed. In the substrate 140 also, a through hole 142 is formed. The through hole 132 in the platform 130 and the through hole 142 in the substrate 140 are caused to communicated, and the platform 130 is attached to the substrate 140. The through hole 132 in the platform 130 has a smaller diameter than the through hole 142 in the substrate 140. Therefore, when the optical fiber 30 is inserted in the through hole 142 in the substrate 140, the extremity forming the through hole 132 in the platform 130 acts as a stop, and contacts the end surface of the optical fiber 30. In this way, the positioning of the optical fiber 30 in the axial direction can be achieved.

On the platform 130 is mounted the optical element 90. In more detail, the optical element 90 is mounted from the opening on the opposite end of the through hole 132 from the substrate 140, with the optical section 92 in the direction of the through hole 132. The optical section 92 is positioned over the through hole 132, and preferably does not enter therein. Even if the optical section 92 enters the through hole 132, it is preferable that it does not project from the opening of the through hole 132 on the side of the substrate 140. In this way, since the end surface of the optical fiber 30 does not enter the through hole 132, contact of the optical section 92 with the end surface of the optical fiber 30 can be prevented.

For the remainder of the construction the description in the above described embodiments can be applied, and in this embodiment also, the same benefit as in the first embodiment can be achieved. To the optical module of this embodiment, the method of manufacturing the optical module of the first embodiment can be applied, and furthermore the substrate 140 can be attached to allow manufacture.

It should be noted that in the above-described first to sixth embodiments, the example shows a construction with a single optical fiber 30, but the present invention can be applied also to a construction in which a plurality of optical fibers 30 are disposed. In other words, a plurality of optical fibers 30 are disposed in parallel, and at each of the end surfaces of the optical fibers 30, optical elements 20, 40, 60, and 90 and a semiconductor chip 110 can be formed.

Seventh Embodiment

Figure 7:
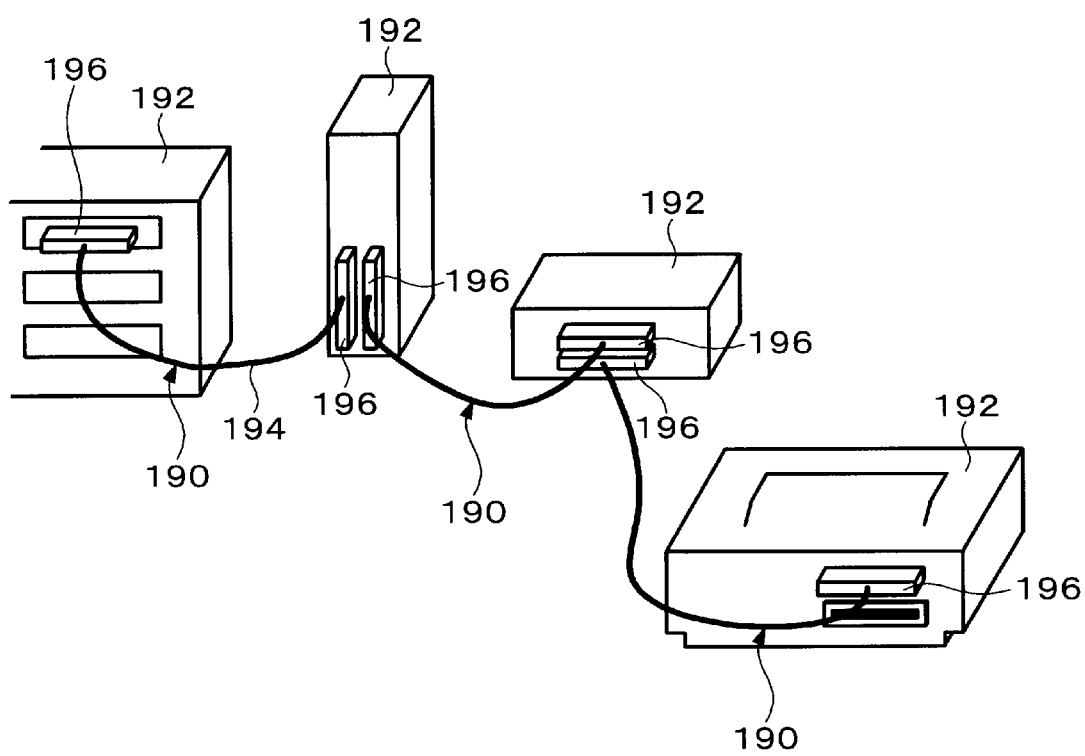
FIG. 7 shows an optical transmission device of a seventh embodiment to which the present invention is applied.

FIG. 7 shows a seventh embodiment of an optical transmission device to which the present invention is applied. An optical transmission device 190 is used to mutually connect electronic instruments 192 such as a computer, a display, a memory device, and a printer. The electronic instruments 192 may equally be data communications devices. The optical transmission device 190 may have plugs 196 provided at both ends of a cable 194. The cable 194 includes one or a plurality of (at least one) optical fiber(s) 30 (see FIG. 1). At both ends of the optical fiber 30, a platform 10 as shown in FIG. 1 is provided. The fixing of the optical fiber 30 to the platform 10 is as described above. The plugs 196 incorporate a platform 10. Alternatively, the plugs 196 may incorporate an optical module as described above in the second embodiment to sixth embodiment.

The optical element 20 mounted on one platform 10 (first platform) connected to the optical fiber 30 is a light-emitting element. An electrical signal output from one electronic instrument 192 is converted to an optical signal by the optical element 20, which is a light-emitting element. The optical signal passes through the optical fiber, and is input to the optical element 20 mounted on the other platform 10 (second platform). This optical element 20 is a light-receiving element, and converts the input optical signal to an electrical signal. The electrical signal is input to the other electronic instrument 192. In this way, this embodiment of the optical transmission device 190 enables information to be transferred between the electronic instruments 192 by means of a optical signal.

Eighth Embodiment

Figure 8:
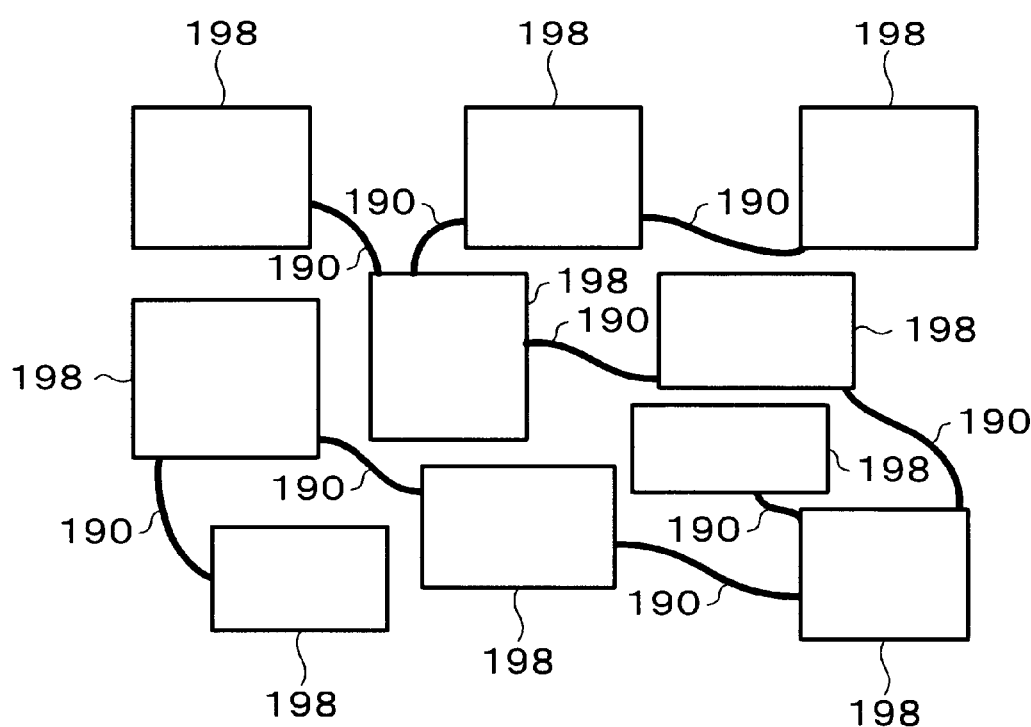
FIG. 8 shows a form to use an optical transmission device of an eighth embodiment to which the present invention is applied.

FIG. 8 shows an eighth embodiment of a method of use of an optical transmission device to which the present invention is applied. The optical transmission device 190 connects electronic instruments 198. As the electronic instruments 198 may be cited liquid crystal display monitors or digital support CRTs (These may be used in the financial, communications marketing, medical, and educational fields.), liquid crystal projectors, plasma display panels (PDP), digital TV, retail cash registers (for POS (Point of Sale Scanning)), video, tuners, games consoles, printers, and so on.

Ninth Embodiment

Figure 9:
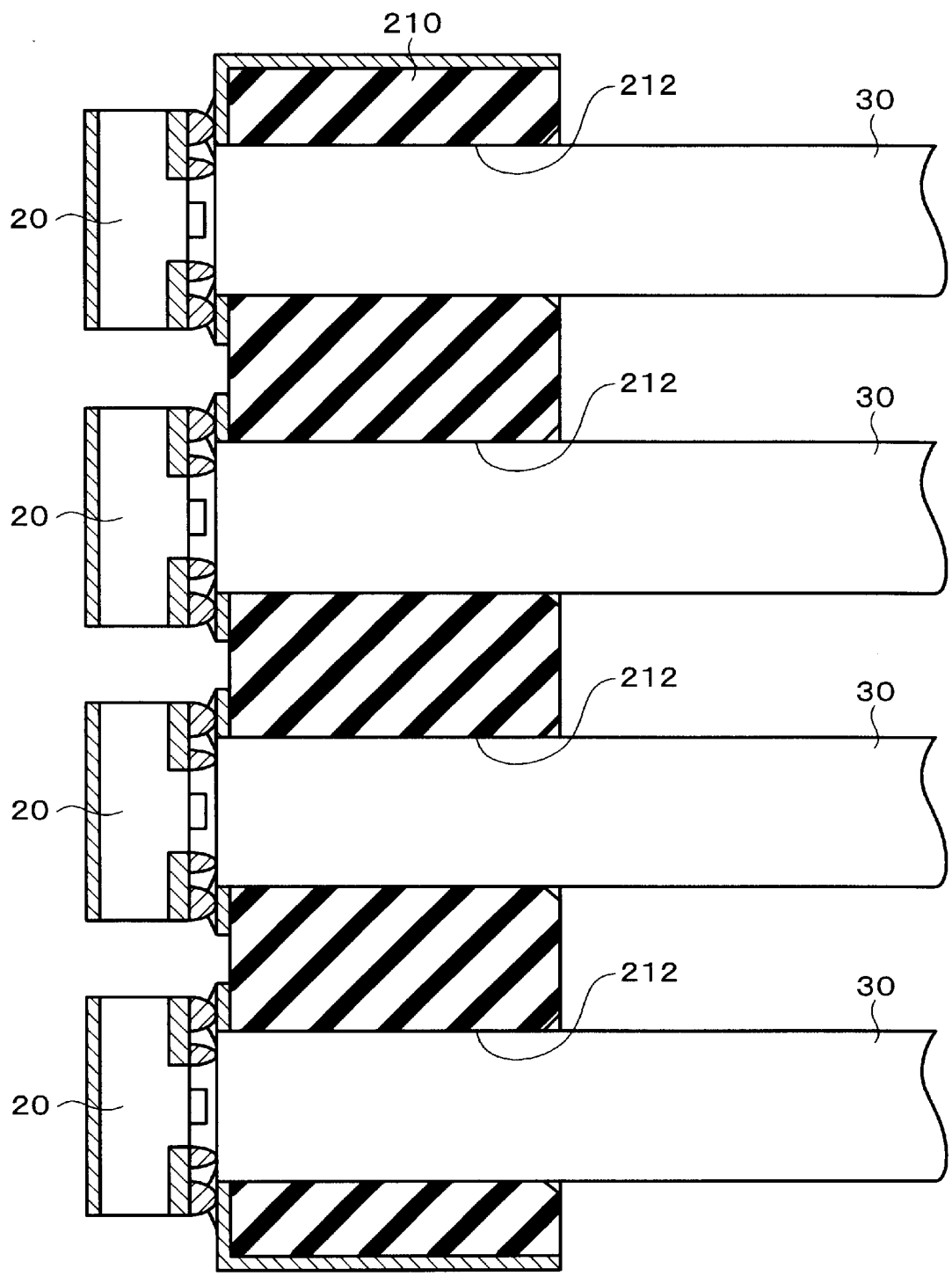
FIG. 9 shows an optical module of a ninth embodiment to which the present invention is applied.

FIG. 9 shows a ninth embodiment of an optical module to which the present invention is applied. This optical module includes a platform 210, a plurality of optical elements 20, and a plurality of optical fibers 30. In the platform 210, a plurality of holes 212 are formed, and in each hole 212 is inserted an optical fiber 30. The optical fibers 30 are provided to correspond with respective optical elements 20. The example shown in FIG. 9 is an optical module having four optical elements 20, and when this is used for transmitting a color image signal, the optical elements 20 and optical fibers 30 are used for transmitting red, green, and blue signals and a clock signal.

For the remainder of the construction the description in the first embodiment can be applied. The optical module of this embodiment can also be packaged by means of resin or the like.

Tenth Embodiment

Figure 10:
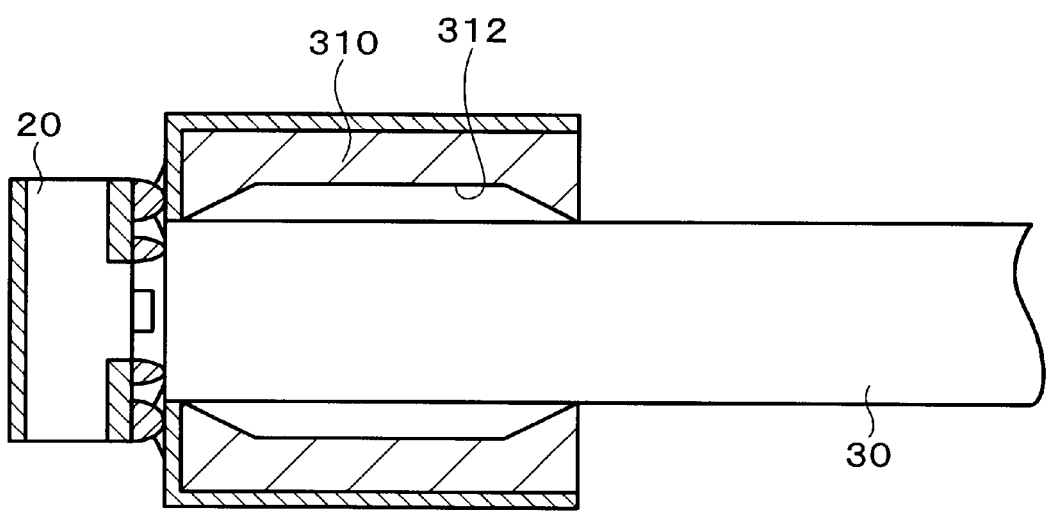
FIG. 10 shows an optical module of a tenth embodiment to which the present invention is applied.

FIG. 10 shows a tenth embodiment of an optical module to which the present invention is applied. This optical module is provided with an optical element 20, a platform 310, and an optical fiber 30.

The platform 310 is formed of a semiconductor such as silicon or the like, and in a region not to be electrically conductive with respect to the optical element 20 and the like, preferably has an insulating film. In the platform 310, a through hole 312 for insertion of the optical fiber 30 is formed. The through hole 312 is formed to include opening extremities, and an intermediate portion of larger diameter than the opening extremities. The opening extremities and intermediate portion are connected by tapered portions.

Such a through hole 312 can be formed as follows. First, in the region of formation of the through hole 312, a layer patterned to the opening is formed on the platform 310. This layer may be of resist, or may be an oxidized file, or may be a film formed by the application of chemical vapor deposition (CVD). Then the opening portion of the layer of resist or the like (the surface of the platform 310) is etched. For the etching, preferably dry etching is applied. The dry etching may be reactive ion etching (RIE). As the etching wet etching may also be applied. In this way, a recess (a non-penetrating hole) is formed in the surface of the platform 310.

Then in the portion of the platform 310 in which the recess is formed, using a laser (for example a YAG laser or $CO_2$ laser) or the like, a small hole is formed. The laser beam can be directed confirming the position of the recess. The laser beam may be directed from one side of the platform 310 only to form the small hole, or may be directed from both sides of the platform 310 (either sequentially or simultaneously). If the laser beam is directed from both sides, the effect on the platform 310 is reduced. It should be noted that if the laser beam is directed from both sides, a recess is preferably formed on both sides of the platform 310.

Next, the small hole is enlarged to form the through hole 312. For example, applying wet etching, the inner walls of the small hole may be etched. As etching solution may be used, for example, a mixture of hydrofluoric acid and ammonium fluoride in aqueous solution (buffered hydrofluoric acid). Then the layer of resist or the like is removed as required.

For the remainder of the construction the description in the first embodiment can be applied. The optical module of this embodiment can also be packaged by means of resin or the like. It should be noted that gaps between the through hole 312 and the optical fiber 30 are preferably filled with a filling material such as resin or the like.

In the above embodiments, an optical fiber was used as an optical waveguide, but a sheet form or strip form optical waveguide may equally be used. The optical waveguide may be formed of polyamide resin.

What is claimed is:

1. An optical module comprising:
   an optical element having an optical section;
   an optical waveguide having an end surface, the end surface facing the optical section;
   a platform on which the optical element and the optical waveguide are mounted; and
   a stop disposed between the end surface of the optical waveguide and the optical element, the stop disposed in contact with the optical waveguide, the stop disposed in a state of non-contact with the optical section.

2. The optical module as defined in claim 1,
   wherein a conductive layer is formed on the platform; and
   wherein the optical element has at least one bump on a surface on which the optical section is formed.

3. The optical module as defined in claim 2,
   wherein a through hole is formed in the platform; and
   wherein the optical section is mounted on the optical element in a manner to oppose one opening of the through hole.

4. The optical module as defined in claim 3,
   wherein the optical waveguide is inserted in the through hole;
   wherein the optical element has at least one non-electrical-connection bump on the surface on which the optical section is provided; and
   wherein the non-electrical-connection bump contacts the end surface of the optical waveguide, and has a function to maintain a non-contact disposition of the optical waveguide with the optical section.

5. The optical module as defined in claim 3,
   wherein a projection is formed in the through hole to reduce the diameter of the through hole;
   wherein the optical waveguide is inserted in the through hole; and
   wherein the projection functions as the stop that contacts the end surface of the optical waveguide.

6. The optical module as defined in claim 5,
   wherein the through hole has a recess accommodating the optical element at a first opening thereof opposite to a second opening thereof at which the optical waveguide is inserted.

7. The optical module as defined in claim 3,
   wherein a substrate is mounted on the platform, the substrate having a through hole of which diameter is larger than the diameter of the through hole formed in the platform;
   wherein the through holes formed in the platform and the substrate are connected;
   wherein the optical waveguide is inserted in the through hole formed in the substrate; and
   wherein a part of one surface of the platform functions as the stop that contacts the end surface of the optical waveguide.

8. The optical module as defined in claim 3,
   wherein the stop is formed by an optically transmitting member; and
   wherein the stop is formed at the one opening of the through hole so as to contact the end surface of the optical waveguide.

9. The optical module as defined in claim 1,
   wherein the optical waveguide is inserted in the through hole; and
   wherein the first part of the bump is formed in a position to be bonded to the conductive layer, and a second part of the bump is formed in a position to contact the end surface of the optical waveguide.

10. The optical module as defined in claim 1,
    wherein the stop contacts the end surface of a cladding, avoiding a core of the optical waveguide.

11. The optical module as defined in claim 1, further comprising:
    a sealing portion for sealing at least an electrical connection portion of the optical element.

12. The optical module as defined in claim 11,
    wherein the sealing portion comprises a first resin portion for sealing the electrical connection portion of the optical element, and a second resin portion for sealing the first resin portion.

13. The optical module as defined in claim 12,
    wherein the first resin portion is softer than the second resin portion.

14. An optical transmission device comprising:
    first and second platforms;
    a light-emitting element having a light-emitting section and mounted on the first platform;
    a light receiving element having a light-receiving section and mounted on the second platform;
    an optical waveguide of which end portions being inserted into the first and the second platforms, the optical waveguide having first and second end surfaces;
    a first stop disposed between the first end surface of the optical waveguide and the light-emitting element, the first stop disposed in contact with the first end surface, the first stop disposed in a state of non-contact with the light-emitting section; and
    a second stop disposed between the second end surface of the optical waveguide and the light-receiving element, the second stop disposed in contact with the second end surface, the second stop disposed in a state of non-contact with the light-receiving section.

15. The optical transmission device as defined in claim 14, further comprising:
    a plug connected to the light-emitting element; and
    another plug connected to the light-receiving element.

16. A method of manufacturing an optical module comprising the steps of:
    mounting an optical element having an optical section on a platform; and
    positioning an optical waveguide with its end surface facing the optical section,
    wherein in the step of positioning the optical waveguide, a stop is disposed between the end surface of the optical waveguide and the optical element in contact with the optical waveguide and in a state of non-contact with the optical section.

17. The method of manufacturing an optical module as defined in claim 16, further comprising:
    a step of forming a first resin portion by sealing the electrical connection portion of the optical element by means of a first resin; and
    a step of forming a second resin portion by sealing the first resin portion by means of a second resin after the step of forming the first resin portion.

18. The method of manufacturing an optical module as defined in claim 17, wherein the first resin portion is softer than the second resin portion.

19. An optical module comprising:

an optical element having an optical section;

an optical waveguide having an end surface, the end surface facing the optical section, a platform on which the optical element is mounted, the platform having a through hole formed therein; and a stop disposed between the end surface of the optical waveguide and the optical element, the stop disposed in a state of non-contact with the optical section, wherein a projection is formed in the through hole to reduce the diameter of the through hole;

wherein the optical waveguide is inserted in the through hole; and wherein the projection functions as the stop that contacts the end surface of the optical waveguide.

* * * * *